United States Patent [19]

Lee et al.

[11] Patent Number: 5,674,782
[45] Date of Patent: Oct. 7, 1997

[54] METHOD FOR EFFICIENTLY REMOVING BY-PRODUCTS PRODUCED IN DRY-ETCHING

[75] Inventors: Nae-in Lee, Suwon; Moon-han Park, Seoul; Young-wug Kim, Suwon; Kwan-young Oh, Kyungki-do, all of Rep. of Korea

[73] Assignee: Samsung Electronics Co., Ltd., Suwon, Rep. of Korea

[21] Appl. No.: 611,432

[22] Filed: Mar. 4, 1996

Related U.S. Application Data

[63] Continuation of Ser. No. 367,537, Jan. 3, 1995, abandoned.

[30] Foreign Application Priority Data

Dec. 31, 1993 [KR] Rep. of Korea .................. 93-32280

[51] Int. Cl.⁶ ............................................ H01L 21/28
[52] U.S. Cl. .......................... 437/193; 437/200; 437/247; 156/646.1; 156/653.1
[58] Field of Search ............................... 437/193, 200, 437/233, 247; 156/646.1, 653.1, 657.1

[56] References Cited

U.S. PATENT DOCUMENTS

| | | | |
|---|---|---|---|
| 4,478,678 | 10/1984 | Watanabe | 156/646 |
| 5,110,408 | 5/1992 | Fujii et al. | 437/233 |
| 5,110,411 | 5/1992 | Long | 156/646.1 |
| 5,200,028 | 4/1993 | Tatsumi | 437/200 |
| 5,378,653 | 1/1995 | Yanagida | 156/646 |
| 5,391,244 | 2/1995 | Kadomura | 156/657 |

Primary Examiner—John Niebling
Assistant Examiner—Thomas G. Bilodeau
Attorney, Agent, or Firm—Cushman Darby & Cushman, IP Group Of Pillsbury Madison & Sutro LLP

[57] ABSTRACT

A method for efficiently removing by-products produced in dry-etching a fabricated structure of a semiconductor device, particularly, a polycide structure. The method includes the steps of sequentially forming a polysilicon layer and a refractory metal silicide layer to overlie previously fabricated structures on a semiconductor substrate, dry-etching the polysilicon layer and the refractory metal silicide layer to form a patterned polysilicon layer and a patterned refractory metal silicide layer, and thermal treating the resultant structure to remove at least one kind of by-product produced in the dry-etching step at a temperature higher than the boiling point of any by-product.

16 Claims, 6 Drawing Sheets

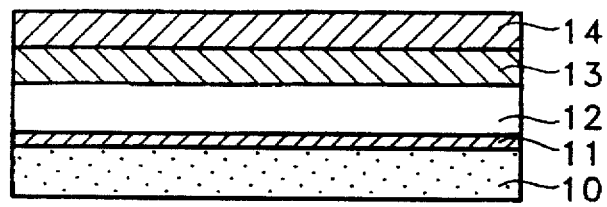
FIG. IA (PRIOR ART)
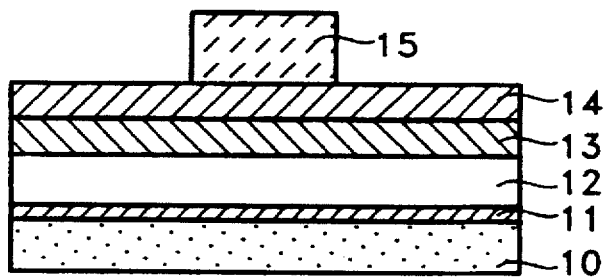
FIG. IB (PRIOR ART)
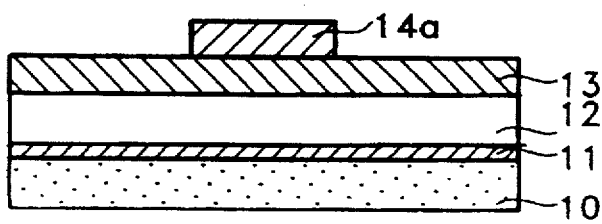
FIG. IC (PRIOR ART)
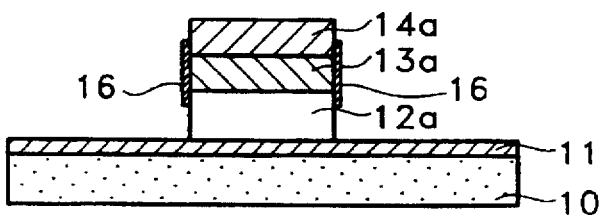
FIG. ID (PRIOR ART)
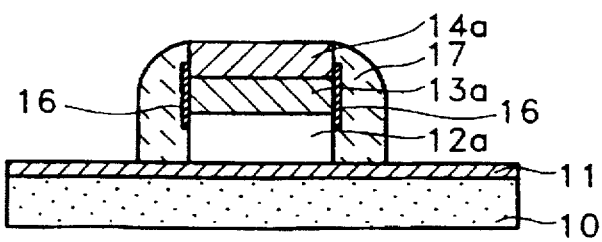
FIG. IE (PRIOR ART)

METHOD FOR EFFICIENTLY REMOVING BY-PRODUCTS PRODUCED IN DRY-ETCHING

This is a continuation of application Ser. No. 08/367,537, filed on Jan. 3, 1995, which was abandoned upon the filing hereof on Mar. 4, 1996.

BACKGROUND OF THE INVENTION

The present invention relates to a method for manufacturing a semiconductor device, and more particularly, to a method for removing by-products produced when dry-etching a polycide structure formed by depositing a refractory metal silicide layer on a polysilicon layer.

As the integration of semiconductor devices has increased, so has the importance of having an electrode with low resistance increased. A polycide structure formed by depositing a refractory metal silicide layer on a polysilicon layer, a substitute for polysilicon electrode, has been widely adopted for bit lines or gates as low resistance material. In manufacturing such a semiconductor device, patterning the polycide structure is generally performed by a dry etching method, like a plasma etching or reactive ion etching. During the dry etching process, various kinds of by-products are produced. Performing subsequent processes, without removing the by-products, may cause problems such as electrical shorts in later-formed interconnection layers.

Hereinbelow, for explaining problems due to the by-products produced in dry etching a polycide structure, the process for forming a gate for which polycide structures are widely adopted will be described.

FIGS. 1A to 1E are cross-sectional diagrams showing a method for forming a gate having a conventional $WSi_x$/polysilicon structure.

FIG. 1A shows a gate oxide layer 11, a polysilicon layer 12, a $WSi_2$ layer 13 and a high temperature oxide (HTO) layer 14 sequentially formed on a semiconductor substrate 10.

FIG. 1B shows a photoresist coated and patterned on HTO layer 14 to form a patterned photoresist 15.

FIG. 1C shows after dry etching the HTO layer 14 to expose the $WSi_2$ layer 13 utilizing the patterned photoresist 15 as an etching mask, that the patterned photoresist 15 is stripped to form an HTO pattern 14a.

FIG. 1D shows that after $WSi_2$ layer 13 and polysilicon layer 12 are dry-etched, utilizing the patterned HTO 14a as an etching mask, a gate having a polycide structure consisting of a patterned $WSi_2$ layer 13a and a patterned polysilicon layer 12a is obtained.

FIG. 1E shows that after depositing HTO on the resultant structure by a low-pressure chemical vapor deposition method (LPCVD), the HTO deposition is anisotropically etched to form HTO spacer 17.

During the conventional method for forming a gate, however, as can be seen in FIG. 1D after the dry etching process of $WSi_2$ layer 13 and polysilicon layer 12, etching by-products 16 adhere to the sidewalls of the gate having a polycide structure consisting of the patterned $WSi_2$ layer 13a and patterned polysilicon layer 12a.

FIGS. 2A to 2C are diagrams useful for explaining the problems arising due to by-products being produced during the etching process when the gate is formed by the aforementioned conventional method.

FIG. 2A is a top-view SEM picture of the HTO spacer shown in FIG. 1E. Here, the profile of the spacer bulges, exhibiting a "hump phenomenon." To examine the cause of the hump phenomenon, the inventors simulated the profile of the HTO spacer in the case when by-products are present on the sidewalls of a $WSi_2$ layer, using the Supreme IV program (system version 5.1).

FIG. 2B shows the result of the simulation, wherein a hump, a swelling of the profile of the HTO spacer 23, is generated if a by-product 22 is present on the sidewalls of $WSi_2$ layer 21.

FIG. 2C shows problems, which occur in subsequent processes, caused by the hump phenomenon. When, HTO spacer 23 is formed over the by-products produced during the dry-etching process to form the gate, the hump phenomenon occurs. Performing a cleaning process on the resultant structure prior to a process for forming a pad polysilicon 24 to etch the by-products, forms slit 25 where the by-products had been present. In the pad polysilicon 24 is formed, over slit 25 a short is generated between the gate and pad polysilicon 24.

In the conventional process, described above, if the etch by-products are not removed, the reliability of subsequent processes and hence semicondutor yields is lowered.

Removal of such by-products, however, is not a problem limited to etching a polycide structure. That is to say, by-products are necessarily produced in etching a polysilicon layer or over-etching an insulating layer overlying a previously deposited conduction layer consisting of aluminum or an aluminum alloy. Thus, efficient removal of the by-products is necessary.

SUMMARY OF THE INVENTION

It is an object of the present invention to provide a method for manufacturing a semiconductor device by which by-products produced in dry etching fabricated structures of the semiconductor device can be removed efficiently.

It is another object of the present invention to provide a method for manufacturing a semiconductor device by which by-products produced in dry etching polycide can be removed efficiently.

It is still another object of the present invention to provide a method for manufacturing a semiconductor device by which by-products produced in dry etching polycide, consisting of $WSi_2$ and polysilicon, can be removed efficiently.

It is still yet another object of the present invention to provide a method for manufacturing a semiconductor device by which by-products produced in dry etching polycide, consisting of $WSi_2$ and polysilicon, can be removed efficiently so that a high temperature oxide spacer having a stable structure can be formed.

To accomplish the aforementioned objects, the present invention comprises the steps of: dry-etching a first material layer composed of any first material; and thermal treating the resultant structure at a temperature higher than the boiling point of any by-product to remove the by-products produced in the dry-etching step. The thermal treating step is performed by a rapid thermal processing (RTP) method or by high vacuum annealing.

To accomplish another object, the present invention comprises the steps of: forming a polysilicon layer to overlie previously fabricated structures on a semiconductor substrate; depositing a refractory metal silicide layer on the polysilicon layer; dry-etching the polysilicon layer and the refractory metal silicide layer to form a patterned polysilicon layer and a patterned refractory metal silicide layer; and thermal treating the patterned polysilicon layer and the patterned refractory metal silicide layer to remove at least one kind of by-product produced in the dry-etching step.

According to one embodiment of the present invention, the thermal treating step is performed at a temperature higher than the boiling point of any by-product.

According to another embodiment of the present invention, the annealing step is performed by a rapid thermal processing (RTP) method or high temperature annealing in an oxygen free atmosphere.

In still another embodiment of the present invention, the refractory metal silicide layer comprises at least one layer selected from the group consisting of $WSi_x$, $TiSi_x$, $MoSi_x$, $TaSi_x$ and $CoSi_x$.

The etching process for patterning the polycide is performed sequentially such that the refractory metal silicide layer is etched and then the polysilicon layer is etched. The silicide etching process is a dry etching using a gas containing fluorine and chloride, e.g., a gas containing $SF_6$ and $Cl_2$. The polysilicon etching process is a dry etching process using various kinds of plasmas as well as a gas containing fluorine and chloride. The kinds of by-products produced depends on the kinds of silicides used the etching methods used and the kinds of gas used for etching, as can be expected. The properties of the by-products such as melting points or boiling points are easily obtained and constitute well-known data. Similarly, for polycide dry etching the kinds of by-products produced during the dry etching process and their properties can be found by considering the kinds of gas used for etching, the etching methods, used and the kinds of material layers to be etched.

The temperature of the thermal treating step is determined by the kinds and boiling points of the impurities expected to be produced during the dry etching process. A temperature higher than the boiling point of any possible by-product is not the only temperature which should be used. Instead, the temperature of the thermal treating step is probably determined by consideration of the characteristics of the particular process. For example, for a process having potential by-products containing expected materials A, B, C, D and E, with their respective boiling points assumed to satisfy A>B>C>D>E, although A has the highest boiling point the boiling point of B or C may preferably be set as the annealing temperature if, experimentally, it turns out that: (1) A is not likely to be produced; (2) thermal treating is difficult to be performed at a temperature higher than the boiling point of A; or (3) the problems in subsequent processes resulting from the by-products can be solved after thermal treating at a temperature lower than the boiling point of A. Therefore, a temperature higher than the boiling points of most, but not necessarily all, of the expected solid by-products is preferably set as the temperature for the thermal treating step. Since the aforementioned concepts cannot be expressed in a uniform percentage, the various factors mentioned above should be considered in determining the temperature of the thermal treating step.

To accomplish still another object, the present invention comprises the steps of: forming a polysilicon layer to overlie previously fabricated structures on a semiconductor substrate; depositing a $WSi_2$ layer on the polysilicon layer; forming a high temperature oxide layer to overlie the $WSi_2$ layer; photo-etching the high temperature oxide layer to form a patterned high temperature oxide layer; dry-etching the $WSi_2$ layer and the polysilicon layer to form a patterned $WSi_2$ layer and a patterned polysilicon layer, the dry-etching utilizing the high temperature oxide layer as an etching mask; and thermal treating the patterned $WSi_2$ layer and the patterned polysilicon layer at a temperature higher than boiling points of the products to remove at least one kind of by-product produced in the dry-etching step.

In one embodiment of the invention, the dry-etching step comprises the steps of dry etching the $WiS_2$ layer using an etching gas containing at least one gas selected from the group consisting of $SF_6$, $Cl_2$ and a mixture thereof and dry etching the polysilicon layer using an etching gas containing at least one gas selected from the group consisting of $Cl_2$, HBr, He—$O_2$ and a mixture thereof.

In one embodiment of the invention, the RTP method is performed for about ten to thirty seconds in the temperature range between about 500° C. and 800° C. in an inert gas atmosphere containing at least one gas selected from the group consisting of nitrogen, argon and a mixture thereof. Also, high vacuum annealing is performed for about one to five minutes in the temperature range between about 500° C. and 700° C. in an inert gas atmosphere containing at least one gas selected from the group consisting of nitrogen, argon and a mixture thereof.

To accomplish still yet another object, the present invention comprises the steps of: sequentially forming a gate oxide layer, a polysilicon layer, $WSi_2$ layer, and a first high temperature oxide layer; photo-etching the first high temperature oxide layer to form a patterned first high temperature oxide layer; dry-etching the $WSi_2$ layer and the polysilicon layer to expose the gate oxide layer and to form a patterned $WSi_2$ layer and a patterned polysilicon layer, the dry-etching utilizing the patterned first high temperature oxide as an etching mask; thermal treating the patterned $WSi_2$ layer and the patterned polysilicon layer to remove at least one kind of by-product produced in the dry-etching step; and forming a second high temperature oxide layer, and thereafter, anisotropically etching the second high temperature oxide layer, to form a high temperature oxide spacer on side surface of the patterned first high temperature oxide layer, the patterned $WSi_2$ layer and the patterned polysilicon layer.

As described above, since the method of manufacturing a semiconductor device according to the present invention can remove by-products produced by dry etching the structures of the semiconductor device efficiently, the reliability of subsequent processes is improved, thereby increasing the yield of the semiconductor devices. Further, according to the present invention, by-products produced in dry etching polycide, consisting of $WSi_2$ and polysilicon, can be removed efficiently, thereby allowing the formation of a gate structure, including a high temperature oxide spacer, having an excellent profile.

BRIEF DESCRIPTION OF THE DRAWINGS

The above objects and advantages of the present invention will become more apparent by describing in detail a preferred embodiment thereof with reference to the attached drawings in which:

FIGS. 1A to 1E are cross-sectional diagrams showing the method for forming a gate having a conventional $WSi_2$/polysilicon structure;

DETAILED DESCRIPTION OF THE INVENTION

An exemplary preferred embodiment of the invention will now be described in detail with reference to the accompanying drawings.

Although the description of the preferred embodiment is limited to a method for removing etch by-products produced in dry etching a gate having a $WSi_2$/polysilicon structure, it will explain the broad concepts of the present invention in more detail.

EMBODIMENT

FIGS. 3A to 3E are cross-sectional diagrams showing the method for manufacturing a semiconductor device according to the present invention.

Figure 2A:
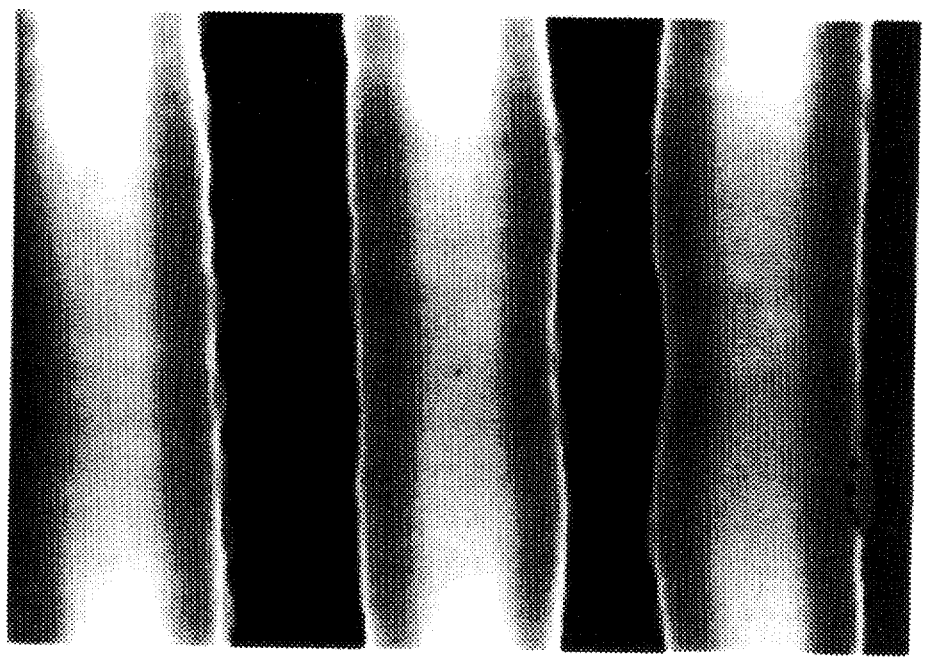
FIGS. 2A to 2C are diagrams for explaining problems arising from by-products being produced during etching processes of the conventional method.
Figure 2B:
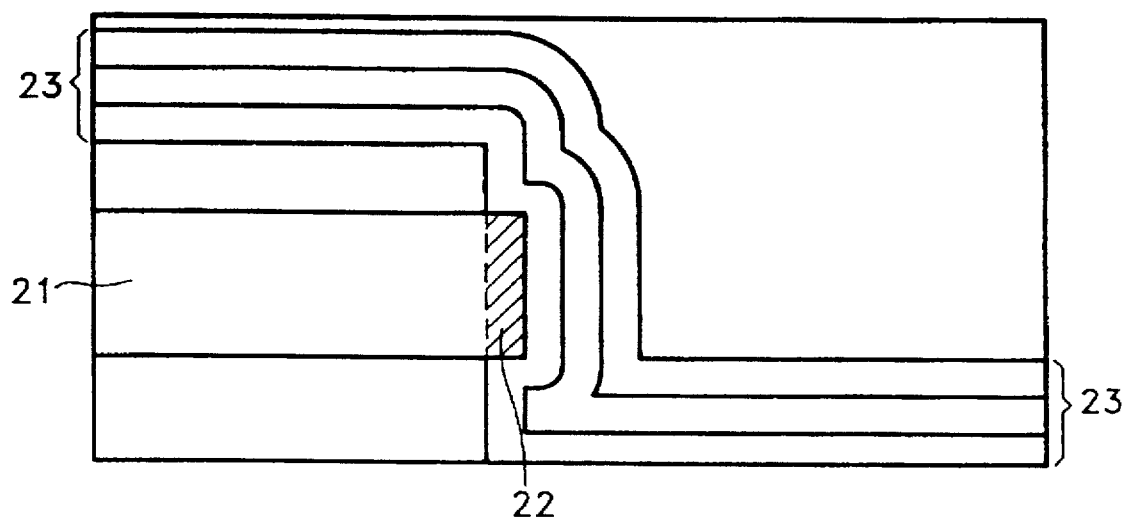
Figure 2C:
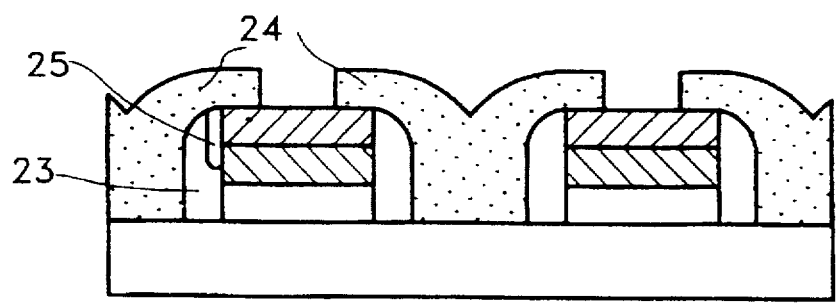
Figure 3A:
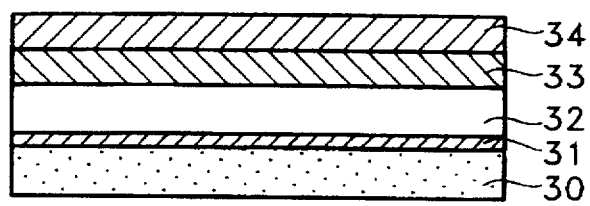
FIGS. 3A to 3E are cross-sectional diagrams showing the method for manufacturing a semiconductor device according to the present invention.

After forming a gate oxide layer 31 on a semiconductor substrate 30, as shown in FIG. 3A, a polysilicon layer 32 is formed on the gate oxide layer 31 to a thickness of 1,000 Å. Subsequently, after forming $WSi_2$ layer 33 on the polysilicon layer 32 to a thickness of 1,000 Å, a first HTO layer 34 is formed on the $WSi_2$ layer 33 to a thickness of 1,500Å by a conventional LPCVD method.

Figure 3B:
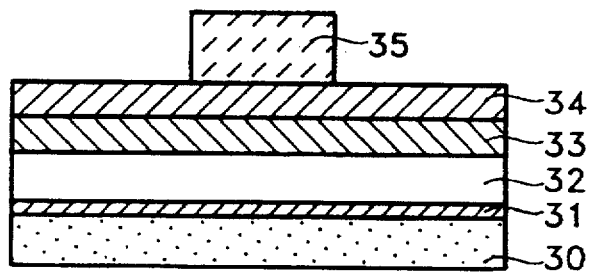

A photoresist is deposited on the first HTO layer 34 to form a photoresist layer (not shown) and the photoresist layer is patterned to form a patterned photoresist 35 as shown in FIG. 3B.

Figure 3C:
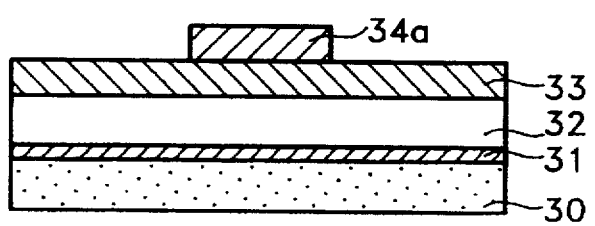

As shown in FIG. 3C, the first HTO layer 34 is dry-etched utilizing the patterned photoresist 35 as an etching mask, to form a first patterned HTO 34a, and thereafter, the patterned photoresist 35 is removed.

Figure 3D:
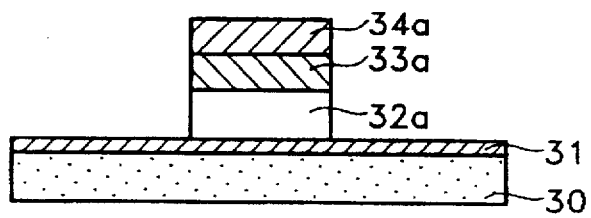

As shown in FIG. 3D, the $WSi_2$ layer 33 and polysilicon layer 32 are sequentially dry-etched, utilizing the first patterned HTO 34a as an etching mask, to form a gate having a polycide structure consisting of the patterned polysilicon layer 32a and patterned $WSi_2$ layer 33a. At this time, the $WSi_2$ layer 33 is etched using a gas containing $SF_6$, $Cl_2$ or a mixture thereof, and the polysilicon layer 32 is etched using a gas containing $Cl_2$, HBr, He—$O_2$ or a mixture thereof.

Thereafter, in order to remove by-products produced in dry etching $WSi_2$ layer 33 and polysilicon layer 32, the resultant structures are thermally treated at a temperature higher than the boiling points of any expected by-product.

The following table 1 represents by-products formed when $WSi_2$ layer 33 and polysilicon layer 32 are etched in the aforementioned manner, to form a gate having a $WSi_2$/polysilicon structure.

TABLE 1

| expected by-product | molecular weight | appearance | melting point (°C.) | boiling point (°C.) |
|---|---|---|---|---|
| $WCl_2$ | 254.76 | solid | * | * |
| $WCl_4$ | 325.66 | solid | * | * |
| $WCl_5$ | 361.12 | solid | 248 | 275.6 |
| $WCl_6$ | 396.57 | solid | 275 | 346.7 |
| $WBr_2$ | 346.66 | solid | 400 | * |
| $WBr_5$ | 583.37 | solid | 276 | 333 |

TABLE 1-continued

| expected by-product | molecular weight | appearance | melting point (°C.) | boiling point (°C.) |
|---|---|---|---|---|
| $WBr_6$ | 663.27 | solid | 232 | * |
| $WO_2Br$ | 375.66 | solid | * | * |
| $WOBr_4$ | 519.47 | solid | 277 | 327 |
| $WOCl_4$ | 341.66 | solid | 211 | 227.5 |
| $WO_2Cl_2$ | 286.75 | solid | 166 | * |
| $WOF_4$ | 275.84 | solid | 110 | 187.5 |
| $WH_2O_4$ | 249.86 | solid | 100 | 1473 |
| $WF_6$ | 297.84 | liquid | 2.5 | 17.5 |
| $SiCl_4$ | 169.9 | liquid | −68.9 | 57.7 |
| $SiF_4$ | 104.1 | gas | −90.3 | −86.2 |
| $SiBr_4$ | 347.7 | liquid | 5 | 153 |
| $SiHBr_3$ | 268.81 | liquid | −73.2 | 108.9 |
| $SiClF_3$ | 120.53 | gas | * | −70.1 |
| $SiCl_2F_2$ | 136.99 | gas | * | −32.3 |
| $SiCl_3F$ | 153.44 | gas | * | −12.3 |
| $SiCl_3H$ | 135.45 | liquid | −128.3 | 32.9 |

As shown in Table 1, the material having the highest boiling point among the expected by-products, is $WH_2O_4$, and the boiling points of most by-products formed in a solid state, such as $WCl_x$, $WBr_x$, $WOBr_x$, $WOCl_x$ and $WOF_4$ are 350° C. or below. Therefore, the thermal treating step is preferably performed at a temperature of 350° C. or higher.

In this embodiment, the thermal treating is performed in a non-oxidizable, i.e., an oxygen-free, atmosphere, by an RTP or high vacuum annealing method. In more detail, the RTP method is performed for about ten to thirty seconds in the temperature range between about 500° C. and 800° C. in an inert gas atmosphere containing nitrogen, argon or a mixture thereof. Also, high vacuum (approximately $10^{-8}$ Torr) annealing is performed for about one to five minutes in the temperature range between about 500° C. and 700° C. in an inert gas atmosphere containing nitrogen, argon or a mixture thereof.

Figure 3E:
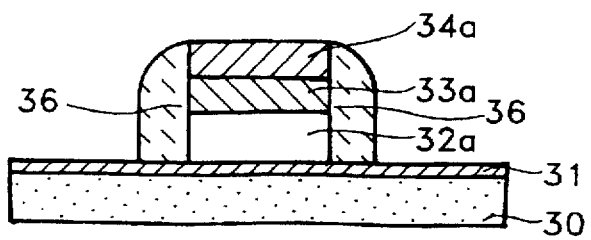

After the annealing process for removing the etch by-products, a second HTO layer (not shown) is formed on the whole surface of the resultant structure by an LPCVD method using a $SiH_4$ and $N_2O$ gas. Thereafter, the second HTO layer is etched anisotropically to form an HTO spacer 36, as shown in FIG. 3E, on the side surfaces of first patterned HTO 34a, patterned polysilicon layer 32a and patterned $WiS_2$ layer 33a.

Figure 4:
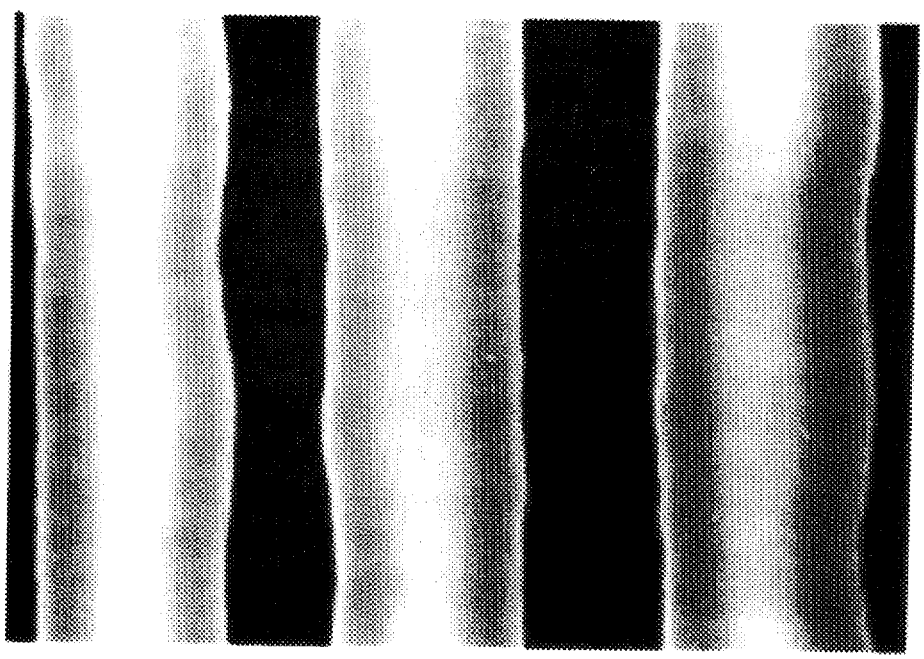
FIG. 4 is a top-viewed SEM picture of a high temperature oxide spacer obtained by an embodiment of the present invention.

FIG. 4 is a top-view SEM picture of a high temperature oxide spacer obtained by an embodiment of the present invention.

As shown by FIG. 4, by-products produced in the dry etching process are completely removed by the annealing process, to thereby obtain an HTO spacer without the hump phenomenon.

Figure 5:
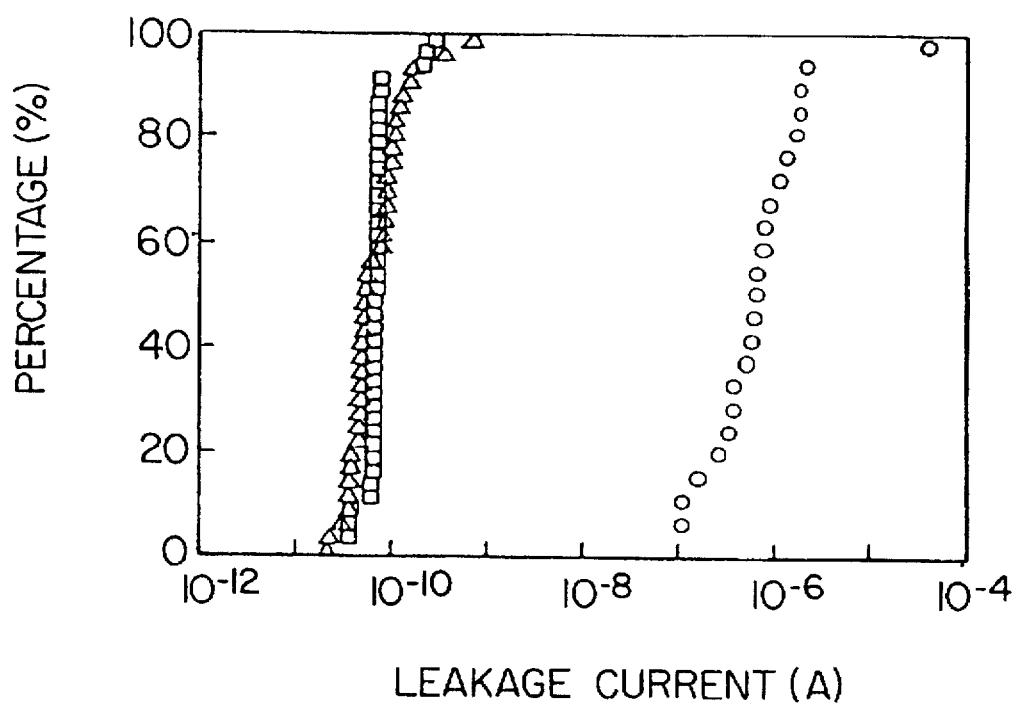
FIG. 5 is a graph for comparing the leakage current between the gate and pad polysilicon for the cases of performing thermal treating in accordance with the present invention and not performing the thermal treating in accordance with the conventional method.

FIG. 5 is a graph for comparing the leakage current between gate and pad polysilicon in the cases of performing thermal treating, as in an embodiment of the present invention, and not performing the thermal treating, as in the conventional method. In FIG. 5, the abscissa represents leakage current and the ordinate represents a cumulative distribution.

The leakage current in the thermal treating method according to the present invention, i.e., an RTP method (marked as "□" in FIG. 5) or high vacuum annealing (marked as "Δ" in FIG. 5), is far less than that according to the conventional method (marked as "○" in FIG. 5).

In the present invention, since by-products produced in dry etching a fabricated structure of the semiconductor device, particularly, polycide, can be removed efficiently, the reliability of the subsequent processes is improved, thereby increasing the yield of semiconductor to be manufactured. Also, in the process for forming a gate having a $WSi_2$/polysilicon structure, the by-products produced in the dry etching process are completely removed to form an HTO spacer having an excellent profile, thereby minimizing the leakage current between the gate and pad polysilicon formed in the subsequent process.

Although the present invention has been described with reference to an illustrative embodiment, the invention is not limited thereto, and it will be apparent to those skilled in the art that various modifications and variations can be made within the scope of the invention.

What is claimed is:

1. A method for manufacturing a semiconductor device comprising the steps of:

forming a polysilicon layer to overlie previously fabricated structures on a semiconductor substrate;

depositing a refractory metal silicide layer on said polysilicon layer;

sequentially dry-etching said polysilicon layer and said refractory metal silicide layer to form a patterned polysilicon layer and a patterned refractory metal silicide layer, using an etching gas comprising fluoride and chloride for dry etching said refractory metal silicide layer and using an etching gas comprising at least one of $Cl_2$, HBr, He—$O_2$ and mixtures thereof for dry etching said polysilicon layer; and thermal treating said patterned polysilicon layer and said patterned refractory metal silicide layer at a temperature higher than 350° C. in a nitrogen atmosphere, to remove at least one by-product produced during said sequential dry-etching steps.

2. The method of claim 1, said thermal treating being performed at a boiling point temperature, higher than 350° C., of said at least one by-product.

3. The method of claim 1, said thermal treating constituting rapid thermal annealing.

4. The method of claim 1, said thermal treating constituting vacuum annealing.

5. The method of claim 1, said refractory metal silicide layer comprising at least one layer selected from the group consisting of $WSi_x$, $TiSi_x$, $MoSi_x$, $TaSi_x$ and $CoSi_x$.

6. A method for manufacturing a semiconductor device comprising the steps of:

forming a polysilicon layer to overlie previously fabricated structures on a semiconductor substrate;

depositing a $WSi_2$ layer on said polysilicon layer;

forming an oxide layer to overlie said $WSi_2$ layer;

etching said oxide layer to form a patterned high temperature oxide layer;

sequentially dry-etching said $WSi_2$ layer and said polysilicon layer to form a patterned $WSi_2$ layer and a patterned polysilicon layer, said dry-etching utilizing said oxide layer as an etching mask, dry-etching of said $WSi_2$ layer using an etching gas comprising at least one selected from the group consisting of $SF_6$, $Cl_2$ and a mixture thereof, and said dry etching of said polysilicon layer using an etching gas comprising at least one selected from the group consisting of $Cl_2$, HBr, He—$O_2$ and a mixture thereof; and thermal treating said patterned $WSi_2$ layer and said patterned polysilicon layer, to remove by-products produced in said sequential dry-etching steps, in a nitrogen atmosphere at a temperature higher than 350° C. and the boiling point of any one of said by-products.

7. The method of claim 6, said thermal treating constituting rapid thermal treating.

8. The method of claim 6, said thermal treating constituting vacuum annealing.

9. The method of claim 7, said rapid thermal treating temperature being between 500° C. and 800° C.

10. The method of claim 7, said rapid thermal treating being performed for about ten to thirty seconds.

11. The method of claim 8, said vacuum annealing temperature being between 500° C. and 700° C.

12. The method of claim 8, said vacuum annealing being performed for about one to five minutes.

13. A method for manufacturing a semiconductor device comprising the steps of:

sequentially forming a gate oxide layer, a polysilicon layer, a $WSi_2$ layer and a first oxide layer;

etching said first oxide layer to form a patterned first oxide layer;

sequentially dry-etching said $WSi_2$ layer and said polysilicon layer to expose said gate oxide layer and to form a patterned $WSi_2$ layer and a patterned polysilicon layer, said dry-etching using said patterned first oxide as an etching mask, said dry etching of said $WSi_2$ layer using an etching gas comprising $SF_6$ and $Cl_2$;

thermal treating said patterned $WSi_2$ layer and said patterned polysilicon layer, in a nitrogen atmosphere at a temperature higher than 350° C., to remove at least one by-product produced during said sequential dry-etching steps; and forming a second oxide layer, and thereafter, anisotropically etching said second oxide layer, to form an oxide spacer on a side surface of said patterned first oxide layer, said patterned $WSi_2$ layer and said patterned polysilicon layer.

14. The method of claim 1, said nitrogen atmosphere is being formed of $N_2$ gas.

15. The method of claim 6, said nitrogen atmosphere is being formed by $N_2$ gas.

16. The method of claim 13, said nitrogen atmosphere is being formed by $N_2$ gas.

* * * * *